United States Patent [19]
Hosaka

[11] Patent Number: 5,123,478
[45] Date of Patent: Jun. 23, 1992

[54] COOLING APPARATUS FOR ELECTRONIC EQUIPMENT WITH FAIL-SAFE CONDENSATION PROTECTION

[75] Inventor: Tadao Hosaka, Yamanashi, Japan

[73] Assignee: NEC Corporation, Tokyo, Japan

[21] Appl. No.: 691,875

[22] Filed: Apr. 26, 1991

[30] Foreign Application Priority Data

Apr. 26, 1990 [JP] Japan ................... 2-110893

[51] Int. Cl.⁵ .............. H05K 5/00; H05K 7/20; H02B 1/20; G05D 23/00
[52] U.S. Cl. ................... 165/35; 165/39; 165/40; 165/80.4; 165/921; 236/91 F; 236/44 R; 361/382; 361/385
[58] Field of Search .......... 165/30, 32, 35, 39, 165/40, 921, 80.4; 236/91 F, 44 R; 361/381, 382, 385

[56] References Cited

U.S. PATENT DOCUMENTS

| | | |
|---|---|---|
| 3,481,393 | 12/1969 | Chu ................... 361/385 |
| 3,807,489 | 4/1974 | Minbiole et al. ........... 361/385 |
| 4,397,301 | 8/1983 | Onno ................... 236/91 F |
| 4,495,780 | 1/1985 | Kaneko et al. ........... 361/381 |
| 4,512,161 | 4/1985 | Logan ................... 361/385 |
| 4,718,478 | 1/1988 | Huber ................... 236/91 F |
| 4,729,424 | 3/1988 | Mizuno et al. ........... 165/30 |
| 4,784,213 | 11/1988 | Eager et al. ........... 165/30 |

OTHER PUBLICATIONS

Proceedings of the International Symposium on Cooling Technology for Electric Equipment, Mar. 17-21, 1987, Hilton Hawaiian Village Hotel, Honolulu, Hawaii, Cooling Technology for the NEC SX Super Computer, Mizuno et al.

*Primary Examiner*—John K. Ford
*Attorney, Agent, or Firm*—Sughrue, Mion, Zinn Macpeak & Seas

[57] ABSTRACT

A cooling apparatus for cooling a given device which is incorporated in a computer or similar electronic equipment and generates heat by circulating a liquid coolant through the device of interest. A secondary cooling liquid exchanges heat with a primary cooling liquid in a heat exchanger and then flows into the device of the equipment. When the difference in temperature between the secondary cooling liquid and the interior of the equipment decreases beyond a predetermined value, a heat exchanging mechanism is caused to stop operating. On the increase of the difference in temperature beyond the predetermined value, the heat exchanging mechanism is caused to begin operating again. Alternatively, the operation of a secondary cooling liquid feeding mechanism may be interrupted and then set up again on the basis for the above-mentioned difference in temperature.

8 Claims, 3 Drawing Sheets

COOLING APPARATUS FOR ELECTRONIC EQUIPMENT WITH FAIL-SAFE CONDENSATION PROTECTION

BACKGROUND OF THE INVENTION

The present invention relates to a cooling apparatus and, more particularly, to a cooling apparatus for cooling a computer or similar electronic equipment by circulating a liquid coolant to a device of interest which is incorporated in the housing and generates heat.

It is a common practice with the above-described type of cooling apparatus to pump a secondary cooling liquid from a tank to a device which should be cooled and to deliver the liquid having absorbed heat to a heat exchanger. In such a case, a primary cooling liquid such as water is fed from a primary cooling liquid source to the heat exchanger via a three-way valve to exchange heat with the secondary cooling liquid. The opening degree of the three-way valve and, therefore, the amount of supply of the primary cooling liquid to the heat exchanger is controlled by a modutrol motor which is driven by a control signal fed from a controller. The problem with such a conventional cooling system is that when the modutrol motor fails to operate accurately due to some error, the temperature of the secondary cooling liquid is apt to fall excessively and, in the worst case, causes dew condensation to occur in the equipment. Then, not only the operation of the cooling apparatus but also the operation of the equipment itself has to be interrupted.

SUMMARY OF THE INVENTION

It is therefore an object of the present invention to provide a cooling apparatus which frees the interior of electronic equipment from dew condensation even when some error occurs in the apparatus.

It is another object of the present invention to provide a generally improved cooling apparatus for electronic equipment.

An apparatus for cooling a given device which is incorporated in equipment and generates heat by feeding a secondary cooling liquid to the equipment of the present invention comprises a secondary cooling liquid feeding mechanism for circulating the secondary cooling liquid through the given device. A heat exchanging mechanism causes the secondary cooling liquid to exchange heat with a primary cooling liquid fed thereto. A monitoring section monitors the temperature of the given device, the temperature of the interior of the equipment, and the temperature of the secondary cooling liquid. A controller causes the heat exchanging mechanism to stop operating when the monitoring section determines that the difference in temperature between the secondary cooling liquid and the interior of the equipment has decreased beyond a predetermined value, and causes it to begin operating again when the monitoring section determines that the difference in temperature has increased beyond the predetermined value.

Also, an apparatus for cooling a given device which is incorporated in equipment and generates heat by feeding a secondary cooling liquid to the equipment of the present invention comprises a secondary cooling liquid feeding mechanism for circulating the secondary cooling liquid through the given device. A heat exchanging mechanism causes the secondary cooling liquid to exchange heat with a primary cooling liquid fed thereto. A monitoring section monitors the temperature of the given device, the temperature of the interior of the equipment, and the temperature of the secondary cooling liquid. A controller causes the secondary cooling liquid feeding mechanism to stop operating when the monitoring section determines that the difference in temperature between the secondary cooling liquid and the interior of the equipment has decreased beyond a predetermined value, and causes it to begin operating when the monitoring section has determined that the difference in temperature has increased beyond the predetermined value.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
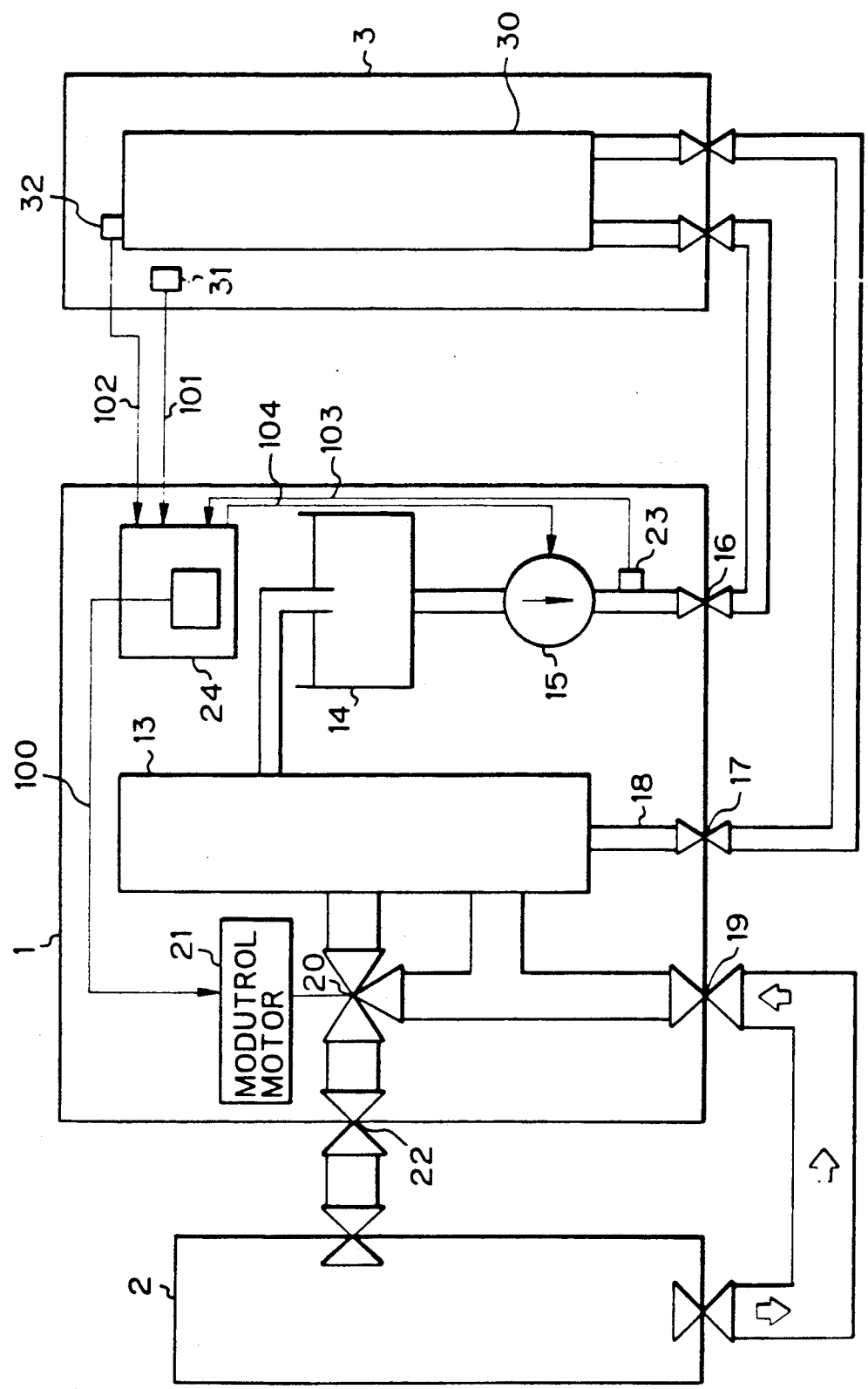
FIG. 1 is a block diagram schematically showing a conventional cooling apparatus.

To better understand the present invention, a brief reference will be made to a prior art cooling apparatus, shown in FIG. 1. As shown, the cooling apparatus, generally 1, has a tank 14 which stores a secondary cooling liquid therein. A pump 15 feeds the primary cooling liquid under pressure from the tank 14 to a device 30 which is accommodated in electronic equipment 3 that generates heat, via an outlet 16. The secondary cooling liquid which circulates through the device 30 and absorbs heat thereof, is drawn into a heat exchanger 13 via an inlet 17 and a conduit 18. A primary cooling liquid is also fed to the heat exchanger 13 from a primary cooling liquid source 2 via an inlet 19 and a three-way valve 20. As a result, heat exchange occurs between the primary and secondary cooling liquids in the heat exchanger 13. The part of the primary cooling liquid undergone heat exchange in the heat exchanger 13 and the part caused to bypass it by the three-way valve 20 are returned to the primary cooling liquid source 2 to undergo heat exchange again.

A controller 24 feeds a control signal to a modutrol motor 21 over a control line 100. In response, the modutrol motor 21 adjusts the opening degree of the three-way valve and, therefore, the amount of supply of the primary cooling liquid to the heat exchanger 13. Specifically, when the modutrol motor 21 closes the port of the valve 20 communicationg to the heat exchanger 13 and opens tfhe port communicating to the primary inlet 19, the entire primary cooling liquid bypasses the heat exchanger 13. When the modutrol motor 21 reverses such fluid commumication of the three-way valve 20 to the heat exchanger 13 and primary liquid inlet 19, the entire primary cooling liquid is admitted into the heat exchanger 13.

Temperature sensors 31, 32 and 23 sense respectively the air temperature inside the interior of the electronic equipment 3, the temperature of the device 30 of interest incorporated in the equipment 3, and the temperature of the secondary cooling liquid being fed to the equipnment 3. The outputs of the temperature sensors 31, 32 and 23 are delivered to the controller 24 over signal lines 101, 102 and 103, respectively. Hence, the controller 24 monitors such three different kinds of temperatures at all times. The controller 24 controls the pump 15 via an operation command line 104. The temperature of the secondary cooling liquid which is monitored by the sensor 23 is so controlled as to remain higher than the air temperature sensed by the sensor 31 by a predetermined value.

The problem with such a conventional cooling apparatus 1 is that when the modutrol motor 21 fails due to some unusual occurrence, the temperature of the secondary cooling liquid is excessively lowered and, in the worst case, causes dew condensation to occur in the equipment 3. Then, the operation of the cooling apparatus 1 has to be stopped immediately as well as the operation of the equipment 3 itself.

Figure 2:
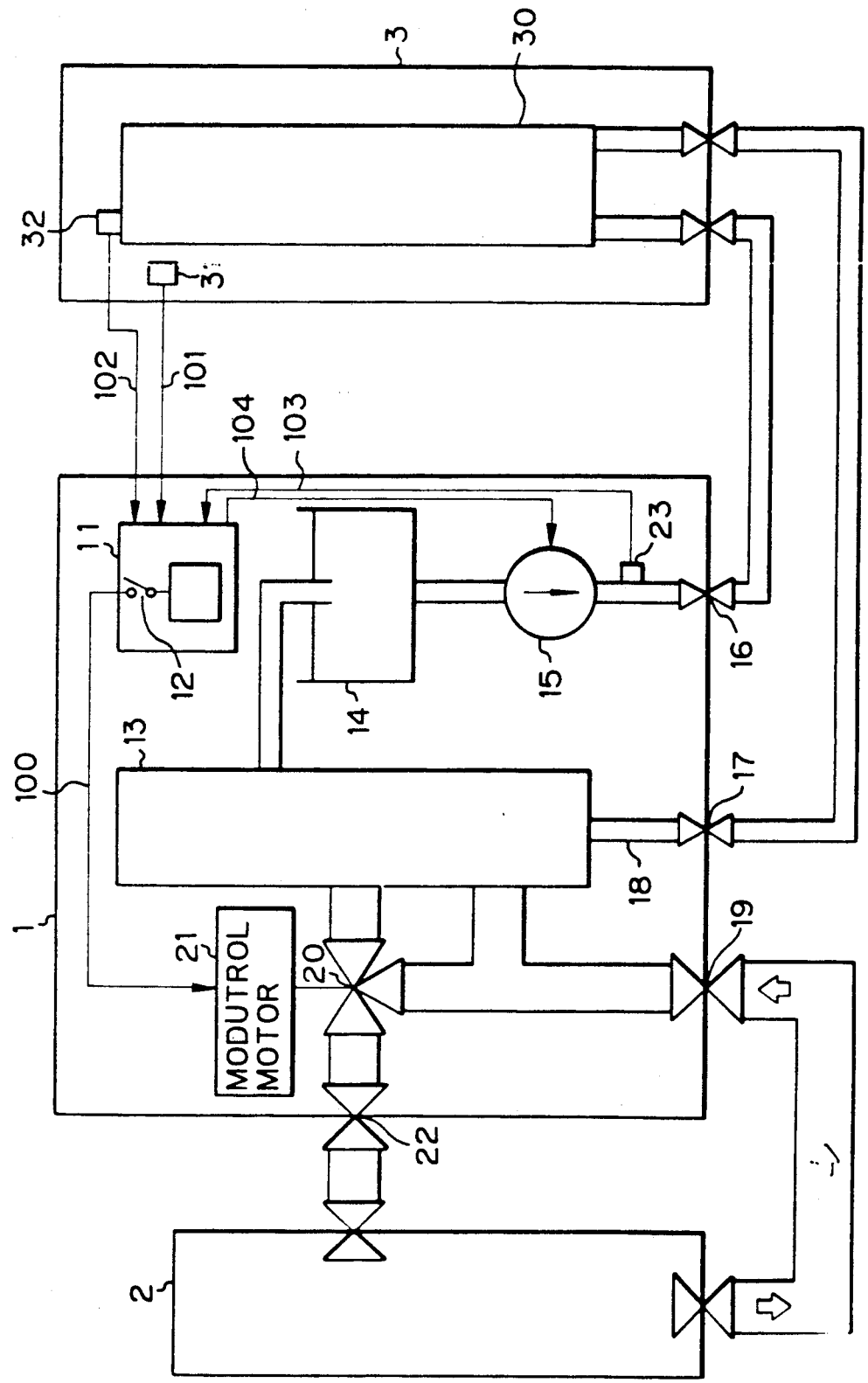
FIG. 2 is a schematic block diagram showing a cooling apparatus embodying the present invention.

Referring to FIG. 2, a cooling apparatus embodying the present invention will be described. In FIG. 2, components identical with the components of the conventional apparatus shown in FIG. 1 are designated by the same reference numerals, and redundant description will be avoided for simplicity. As shown, the cooling apparatus has a controller 11 which incorporates a liquid temperature control switch 12 therein. In response to the outputs of temperatures sensors 23, 31 and 32, the controller 11 controls the pump 15 or the modutrol motor 21. The rest of the construction of the embodiment is essentially similar to the conventional cooling system shown in FIG. 1.

Figure 3:
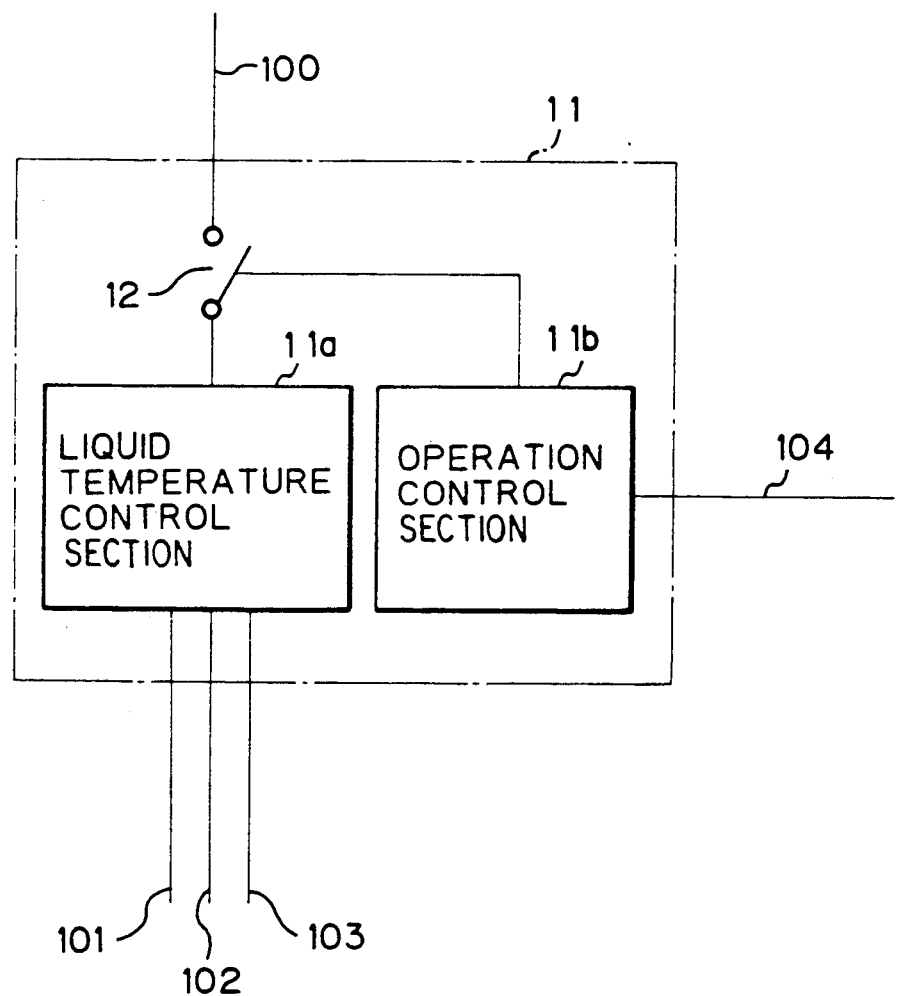
FIG. 3 is a block diagram schematically showing a specific construction of a controller included in the embodiment.

FIG. 3 shows a specific construction of the controller 11 shown in FIG. 2. The controller 11 has a liquid temperature control section 11a, an operation control section 11b, and a control switch 12. The outputs of the temperature sensors 23, 31 and 32 are fed to the liquid temperature control section 11a over signal lines 101, 102 and 103, respectively. The liquid temperature control section 11a, therefore constantly monitors the temperature of the secondary cooling liquid, the air temperature inside the equipment 3 and the temperature of the device 30 of interest. The liquid temperature control section 11a controls a modutrol motor 21 via the control switch 12 and signal line 100 such that the opening degree of a three-way valve 20 is so adjusted as to maintain the secondary cooling liquid at a predetermined temperature. The operation control section 11b controls a pump 15 via an operation command line 104.

In operation, the secondary cooling liquid is fed from the tank 14 to the device of interest 30 incorporated in the equipment 3 by the pump 15 via an outlet 16. The secondary cooling liquid is circulated through the device 30 and absorbed heat thereof is drawn into the heat exchanger 13 via an inlet 17 and a conduit 18. After exchanging heat with the primary cooling liquid in the heat exchanger 13, the secondary cooling liquid is returned to the tank 14. On the other hand, the primary cooling liquid undergone heat exchange in a primary cooling liquid source 2 flows into the cooling apparatus 1 via an inlet 19. At this instant, the three-way valve 20 whose opening degree has been adjusted by the modutrol motor 21 regulates the amount of primary cooling liquid to be admitted into the heat exchanger 13. The part of the primary cooling liquid bypassed the heat exchanger 13 due to the three-way valve 20 and the part passed through the heat exchanger 13 are returned to the primary cooling liquid source 2 via an outlet 22.

The controller 11 constantly monitors the temperature of the secondary cooling liquid being fed to the device of interest 30 via the outlet 16 on the basis of the output of the temperature sensor 23. By the heat exchange in the heat exchanger 13, the temperature of the secondary cooling liquid is so controlled as to remain higher than the air temperature inside the equipment 3 which is monitored via the temperature sensor 31 by a predetermined value. Regarding the temperature of the secondary cooling liquid, the controller 11 delivers a control signal to the modutrol motor 21 over the control line 100. In response, the modutrol motor 21 adjusts the opening degree of the three-way valve 20 and therefore, the amount of heat exchange to occur in the heat exchanger 13. More specifically, the modutrol motor 21 controls the amount of primary cooling liquid from the primary cooling liquid source 2 by controlling the opening degree of the three-way valve 20.

Assume that the temperature of the secondary cooling liquid being sensed by the temperature sensor 23 has noticeably lowered relative to the air temperature inside the equipment 3. Then, the liquid temperature control section 11a of the controller 11 turns off the switch 12 to inhibit the modutrol motor 21 from adjusting the opening degree of the three-way valve 20. As a result, the entire primary cooling liquid bypasses the heat exchanger 13 and, therefore, does not exchange heat with the secondary cooling liquid at all. This causes the temperature of the secondary cooling liquid to rise. The liquid temperature control section 11a detects such an elevation of the temperature of the secondary cooling liquid via the sensor 23. As the temperature of the secondary cooling liquid is restored to the level higher than the air temperature inside the equipment 3 by the predetermined value, the temperature control section 11a turns on the switch 12 to cause the modutrol motor 21 to begin adjusting the three-way valve 20 again. Then, the primary cooling liquid is allowed to exchange heat with the secondary cooling liquid in the heat exchanger 13. Thereafter, the control section 11a turns the switch 12 on or off in response to the outputs of the temperature sensors 23 and 31, so that the modutrol motor 21 executes or interrupts the adjustment of the three-way valve 20, as needed. Hence, the operation of the equipment 3 itself is not interrupted at all.

Alternatively, on such a fall of the temperature of the secondary cooling temperature relative to the air temperature inside the equipment 3, the operation control section 11b may interrupt the operation of the pump 15 by feeding a control signal thereto over the operation command line 104. In this case, the liquid temperature control section 11a does not turn off the switch 12. As a result, the secondary cooling liquid is prevented from being pumped to the device of interest 30. Then, the secondary cooling liquid is heated by the device 30. As soon as the temperature sensor 32 senses that the temperature of the device 30 has risen beyond the value higher than the air temperature inside the equipment 3 by the predetermined value, the operation control section 11b causes the pump 15 to begin operating. Consequently, the secondary cooling liquid which has exchanged heat with the primary cooling liquid in the heat exchanger 13 is again pumped to the device 30. Thereafter, the operation control section 11b controls the pump 15 on or off in response to the outputs of the temperature sensors 23, 31 and 32. The equipment 3 is therefore allowed to operate without interruption.

As stated above, when the modutrol motor 21 fails to perform expected operations due to some error and thereby lowers the temperature of the secondary cooling liquid excessively, the temperature control switch 12 is turned on or off in response to the outputs of the temperature sensors 23 and 31 or, alternatively, the pump 15 is turned on or off in response to the outputs of the temperature sensors 23, 31 and 32. This is successful in preventing the device of interest 30 from being excessively cooled and, therefore, in preventing dew condensation from occurring in the equipment 3. Hence, the equipment 3 is allowed to operate continuously without interruption even when some error occurs in the cooling apparatus.

In summary, it will be seen that the present invention provides a cooling apparatus which frees the interior of electronic equipment from dew condensation even in the event when a failure occurs in the apparatus. This advantage is derived from the fact that, when the difference in temperature between a secondary cooling liquid and the interior of electronic equipment or between a device which generates heat and the interior of the equipment decreases beyond a predetermined value, the operation of a heat exchanging mechanism or that of a secondary cooling liquid supply mechanism incorporated in the apparatus is interrupted. Subsequently, on the increase in the above-mentioned difference beyond the predetermined value, the heat exchanging mechanism or the secondary cooling liquid supply mechanism is operated again.

Various modifications will become possible for those skilled in the art after receiving the teachings of the present disclosure without departing from the scope thereof.

What is claimed is:

1. An apparatus for cooling a given electrical device which is incorporated in the interior of an equipment enclosure and which generates heat, by feeding a secondary cooling liquid to said equipment enclosure, comprising:
    secondary cooling liquid feeding means for circulating said secondary cooling liquid through said given electrical device;
    heat exchanging means for causing said secondary cooling liquid to exchange heat with a primary cooling liquid which is fed to said heat exchanging means;
    monitoring means for monitoring a temperature of said given electrical device, a temperature of the interior of said equipment enclosure, and a temperature of said secondary cooling liquid; and
    control means for causing said heat exchanging means to stop operating when said monitoring means determines that a difference in temperature between said secondary cooling liquid and the interior of said equipment enclosure has decreased beyond a predetermined value at which condensation is likely to occur in said equipment enclosure, and causing said heat exchanging means to begin operating again when said monitoring means has determined that said difference in temperature has increased beyond said predetermined value.

2. An apparatus as claimed in claim 1, wherein said secondary cooling liquid feeding means comprises a tank for storing said secondary cooling liquid after exchanging heat with said primary cooling liquid, and a pump for feeding said secondary cooling liquid from said tank to said given device.

3. An apparatus as claimed in claim 1, further comprising primary cooling liquid feeding means for feeding said primary cooling liquid to said heat exchanging means.

4. An apparatus as claimed in claim 3, further comprising adjusting means for adjusting the amount of said primary cooling liquid to be fed to said heat exchanging means.

5. An apparatus for cooling a given electrical device which is incorporated in the interior of an equipment enclosure and which generates heat, by feeding a secondary cooling liquid to said equipment enclosure, comprising:
    secondary cooling liquid feeding means for circulating said secondary cooling liquid through said given electrical device;
    heat exchanging means for causing said secondary cooling liquid to exchange heat with a primary cooling liquid which is fed to said heat exchanging means;
    monitoring means for monitoring a temperature of said given electrical device, a temperature of the interior of said equipment enclosure, and a temperature of said secondary cooling liquid; and
    control means for causing said secondary cooling liquid feeding means to stop operating when said monitoring means determines that a difference in temperature between said secondary cooling liquid and the interior of said equipment enclosure has decreased beyond a predetermined value at which condensation is likely to occur in said equipment enclosure, and causing said secondary cooling liquid feeding means to begin operating again when said monitoring means has determined that said difference in temperature has increased beyond said predetermined value.

6. An apparatus as claimed in claim 5, wherein said secondary cooling liquid feeding means comprises a tank for storing said secondary cooling liquid after exchanging heat with said primary cooling liquid, and a pump for feeding said secondary cooling liquid from said tank to said given device.

7. An apparatus as claimed in claim 5, further comprising primary cooling liquid feeding means for feeding said primary cooling liquid to said heat exchanging means.

8. An apparatus as claimed in claim 7, further comprising adjusting means for adjusting the amount of said primary cooling liquid to be fed to said heat exchanging means.

* * * * *

UNITED STATES PATENT AND TRADEMARK OFFICE
CERTIFICATE OF CORRECTION

PATENT NO. : 5,123,478
DATED : June 23, 1992
INVENTOR(S) : TADAO HOSAKA

It is certified that error appears in the above-indentified patent and that said Letters Patent is hereby corrected as shown below:

On the title page: Item [30] under "Foreign Application Priority Data" delete "2-110893".

Signed and Sealed this

Fourteenth Day of September, 1993

Attest:

BRUCE LEHMAN

*Attesting Officer*     *Commissioner of Patents and Trademarks*